United States Patent
Hwang et al.

(10) Patent No.: US 12,356,724 B2
(45) Date of Patent: Jul. 8, 2025

(54) DOUBLE-SIDED INTEGRATED CIRCUIT DIE AND INTEGRATED CIRCUIT PACKAGE INCLUDING THE SAME

(71) Applicant: Myeong-Eun Hwang, Seoul (KR)

(72) Inventors: Myeong-Eun Hwang, Seoul (KR); In Suh Hwang, Seoul (KR)

(73) Assignee: Myeong-Eun Hwang, Seoul (KR)

( * ) Notice: Subject to any disclaimer, the term of this patent is extended or adjusted under 35 U.S.C. 154(b) by 0 days.

(21) Appl. No.: 18/900,415

(22) Filed: Sep. 27, 2024

(65) Prior Publication Data

US 2025/0151411 A1    May 8, 2025

(30) Foreign Application Priority Data

Nov. 8, 2023   (KR) .................. 10-2023-0151896

(51) Int. Cl.
  *H10D 88/00* (2025.01)
  *H01L 23/48* (2006.01)
  *H01L 25/065* (2023.01)

(52) U.S. Cl.
  CPC ......... *H10D 88/101* (2025.01); *H01L 23/481* (2013.01); *H01L 25/0657* (2013.01); *H01L 2225/06541* (2013.01); *H01L 2225/06589* (2013.01)

(58) Field of Classification Search
  CPC ............. H01L 27/0694; H01L 23/481; H01L 2225/06541
  See application file for complete search history.

(56) References Cited

U.S. PATENT DOCUMENTS

| | | | |
|---|---|---|---|
| 11,049,846 B2 | 6/2021 | Uh et al. | |
| 11,552,055 B2 | 1/2023 | Song et al. | |
| 2012/0187567 A1* | 7/2012 | Lee | H01L 23/481 |
| | | | 257/774 |
| 2014/0124777 A1 | 5/2014 | Nakatani et al. | |
| 2020/0135684 A1 | 4/2020 | Kim et al. | |
| 2021/0233851 A1 | 7/2021 | Chun | |
| 2022/0059528 A1* | 2/2022 | Chiu | H01L 29/7787 |
| 2022/0068884 A1* | 3/2022 | Choi | H01L 23/5386 |
| 2022/0293513 A1* | 9/2022 | Li | H01L 27/0694 |
| 2022/0320084 A1* | 10/2022 | Huang | H01L 27/0694 |

(Continued)

FOREIGN PATENT DOCUMENTS

| | | | | |
|---|---|---|---|---|
| CN | 114373490 A | * | 4/2022 | ............... G11C 7/18 |
| JP | 2023-544214 A | | 10/2023 | |

(Continued)

OTHER PUBLICATIONS

Korean Notice of Allowance for Korean Application No. 10-2023-0151895 dated Jul. 11, 2024, Total of 5 pages.

(Continued)

*Primary Examiner* — Mamadou L Diallo
(74) *Attorney, Agent, or Firm* — Sughrue Mion, PLLC (57) ABSTRACT

According to one aspect of the disclosure, there is provided an integrated circuit die includes: a substrate including a front side and a back side opposite to the front side; a front structure including a first element layer on the front side of the substrate and a first wiring layer on the first element layer; and a back structure including a second element layer on the back side of the substrate and a second wiring layer on the second element layer.

8 Claims, 8 Drawing Sheets

(56) References Cited

U.S. PATENT DOCUMENTS

| | | | |
|---|---|---|---|
| 2023/0299049 A1* | 9/2023 | Deshpande | H01L 23/481 |
| 2023/0317718 A1* | 10/2023 | Sharma | H01L 29/517 |
| | | | 257/20 |
| 2024/0063092 A1* | 2/2024 | Shi | H01L 27/0694 |
| 2024/0072070 A1* | 2/2024 | Chang | H01L 21/84 |
| 2024/0222339 A1* | 7/2024 | Ting | H01L 21/568 |
| 2024/0274523 A1* | 8/2024 | Or-Bach | H01L 23/49844 |

FOREIGN PATENT DOCUMENTS

| | | | |
|---|---|---|---|
| KR | 10-2020-0047845 A | 5/2020 | |
| KR | 10-2020-0108668 A | 9/2020 | |
| WO | 2013/145043 A1 | 10/2013 | |
| WO | WO-2022191924 A1 * | 9/2022 | H01L 21/823475 |

OTHER PUBLICATIONS

Korean Notice of Preliminary Examination for Korean Application No. 10-2023-0151895 dated Dec. 20, 2023, Total of 8 pages.

\* cited by examiner

DOUBLE-SIDED INTEGRATED CIRCUIT DIE AND INTEGRATED CIRCUIT PACKAGE INCLUDING THE SAME

CROSS-REFERENCE TO RELATED APPLICATION

This application claims priority from Korean Patent Application No. 10-2023-0151895 filed on Nov. 6, 2023, in the Korean Intellectual Property Office, now Korean Patent No. 10-2686026 issued on Jul. 12, 2024, the disclosure of which is incorporated herein by reference in its entirety.

BACKGROUND

1. Field

The disclosure relates to an integrated circuit die in which integrated circuits are formed on both sides of a substrate of the die, and an integrated circuit package including the same.

2. Description of the Related Art

Semiconductor chips are typically formed into a die or wafer form by repeatedly using a lithographic process to fabricate an integrated circuit (IC) on one side of a substrate and grinding or polishing the other side. Two approaches to increase interconnect and component density of semiconductor chips are a three-dimensional (3D) package and 3D IC.

The 3D package (System in Package, Chip Stack MCM, or Multi-Chip Module, etc.) has two or more chips (or ICs) stacked vertically to reduce space or improve connectivity. In most 3D packages, stacked chips are wired together along their edges. This edge wiring slightly increases the length and width of the package and typically requires an additional "interposer" layer between the chips. In some new 3D packages, a through silicon via (TSV) replaces edge wiring by forming vertical connections through a chip body. Therefore, TSV-based 3D packages may be flatter than edge wire-based 3D packages because the length or width of the package does not increase and no interposer is required.

The 3D IC is a single integrated circuit made by stacking silicon wafers and/or dies and interconnecting them vertically to function as a single component. By using TSV technology, the 3D IC may pack a lot of functionality into a small "footprint." Wafer-stacked components may be heterogeneous, combining, for example, CMOS logic, DRAM, and III-V material into a single IC package. In addition, critical electrical paths through components may be significantly shortened, resulting in higher operating speeds. Wide I/O 3D DRAM memory standard (JEDEC JESD229) includes a TSV in its design.

The TSV may enable all manner of chip integration and wafer-level packaging by generally providing increased interconnect bandwidth, increased interconnect density, and reduced interconnect resistance. In addition, the TSV may also significantly reduce packaging processes across many device types and many industries, particularly in processor chips, accelerator chips, photonic chips, and consumer device targeted chips. A method of implementing a TSV will be discussed later.

SUMMARY

The inventive concept of the disclosure relates an integrated circuit die capable of improving all the performances of a semiconductor system by increasing the integration density of a semiconductor IC and providing high-speed signal transmission between components, and an integrated circuit package including the integrated circuit die.

The inventive concept of the disclosure relates an integrated circuit die capable of implementing a semiconductor integrated circuit based on various materials such as not only silicon but also gallium arsenide (GaAs), gallium nitride (GaN), and silicon carbide (SiC), which are attracting attention as next-generation power semiconductor materials, and an integrated circuit package including the integrated circuit die.

The inventive concept of the disclosure is not limited to the above objective(s), but other objective(s) not described herein may be clearly understood by one of ordinary skill in the art from descriptions below.

According to an aspect of the disclosure, there is provided an integrated circuit die includes: a substrate including a front side and a back side opposite to the front side; a front structure including a first element layer on the front side of the substrate and a first wiring layer on the first element layer; a back structure including a second element layer on the back side of the substrate and a second wiring layer on the second element layer.

According to an exemplary embodiment, the substrate may be a bulk substrate.

According to an exemplary embodiment, the integrated circuit die may further include a buried insulating layer disposed at least one of between the front side of the substrate and the first element layer and between the back side of the substrate and the second element layer.

According to an exemplary embodiment, the integrated circuit may further include at least one first vertical interconnector penetrating through the substrate and electrically connected to the first element layer and the second element layer.

According to an exemplary embodiment, the integrated circuit may further include at least one second vertical interconnector penetrating through the substrate and the first element layer and electrically connected to the first wiring layer and the second element layer, or penetrating through the substrate and the second element layer and electrically connected to the second wiring layer and the first element layer, or penetrating through the substrate and the first and second element layers and electrically connected to the first wiring layer and the second wiring layer.

According to an exemplary embodiment, the integrated circuit may further include at least one third vertical interconnector penetrating through the substrate, the first and second element layers, and the first and second wiring layers.

According to an exemplary embodiment, the integrated circuit may further include at least one fourth vertical interconnector penetrating through the substrate, the first element layer, and the first wiring layer, or penetrating through the substrate, the second element layer, and the second wiring layer.

According to another aspect of the disclosure, there is provide an integrated circuit package includes: a package substrate; and an integrated circuit die stack structure disposed on the package substrate and including at least two integrated circuit dies, wherein at least one of the integrated circuit dies includes a front structure formed on a front side of a substrate and a back structure formed on a back side of the substrate.

According to an exemplary embodiment, the integrated circuit package may further include at least one connector electrically connecting the package substrate and a lower integrated circuit die of the integrated circuit die stack structure, or electrically connecting between the integrated circuit dies of the integrated circuit die stack structure.

According to an exemplary embodiment, the integrated circuit package may further include a heat dissipation member disposed on a lower side of the package substrate, or between the package substrate and the integrated circuit die stack structure, or between two adjacent integrated circuit dies of the integrated circuit die stack structure, or on an upper side of the integrated circuit die stack structure.

According to embodiments of the inventive concept, the integration density of a semiconductor integrated circuit per unit area may be greatly increased.

In addition, by enabling fast signal transmission between components having not only the same semiconductor manufacturing process but also different semiconductor manufacturing processes, a high-performance interface may be implemented between components of a semiconductor system, for example, a processor and a main memory, thereby improving the performance of the entire semiconductor system.

In addition, heat generated when operating a semiconductor integrated circuit may be effectively transferred and discharged to the outside, thereby lowering the temperature of a semiconductor chip.

Effects obtainable by the embodiments of the inventive concept are not limited to the effects described above, and other effects not described herein may be clearly understood by one of ordinary skill in the art to which the inventive concept belongs from the following description.

BRIEF DESCRIPTION OF THE DRAWINGS

Embodiments of the disclosure will be more clearly understood from the following detailed description taken in conjunction with the accompanying drawings in which.

DETAILED DESCRIPTION

Embodiments according to the inventive concept are provided to more completely explain the inventive concept to one of ordinary skill in the art, and the following embodiments may be modified in various other forms and the scope of the inventive concept is not limited to the following embodiments. Rather, these embodiments are provided so that this disclosure will be thorough and complete, and will fully convey the scope of the inventive concept to one of ordinary skill in the art.

It will be understood that, although the terms first, second, etc. may be used herein to describe various members, components, regions, layers, and/or sections, these members, components, regions, layers, and/or sections should not be limited by these terms. These terms do not denote any order, quantity, or importance, but rather are only used to distinguish one component, region, layer, and/or section from another component, region, layer, and/or section. Thus, a first member, component, region, layer, or section discussed below could be termed a second member, component, region, layer, or section without departing from the teachings of embodiments. For example, as long as within the scope of this disclosure, a first component may be named as a second component, and a second component may be named as a first component.

Unless otherwise defined, all terms (including technical and scientific terms) used herein have the same meaning as commonly understood by one of ordinary skill in the art to which embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment may be implemented differently, a specific process order may be performed differently from the described order. For example, two consecutively described processes may be performed substantially at the same time or performed in an order opposite to the described order.

In the drawings, variations from the illustrated shapes may be expected as a result of, for example, manufacturing techniques and/or tolerances. Thus, the embodiments of the inventive concept should not be construed as being limited to the particular shapes of regions illustrated herein but may include deviations in shapes that result, for example, from manufacturing processes. Like reference numerals in the drawings denote like elements, and thus their overlapped explanations are omitted.

As used herein, the term "and/or" includes any and all combinations of one or more of the associated listed items.

Hereinafter, in describing embodiments of a 3D IC or a 3D IC package according to the inventive concept, an IC die is described using a silicon (Si) die as an example. However, the inventive concept is not limited thereto, and may also be applied to semiconductor dies of other materials such as GaAs, GaN, and SiC. In addition, in the following, the IC die is described for the convenience of explanation, but an integrated circuit die may be replaced with a wafer or chip.

Hereinafter, TSV (Through-Silicon-Via or Thru-Silicon-Via) or TCV (Through-Chip-Via) means a vertical electrical via that passes through a semiconductor wafer or die.

Unless otherwise stated, the expression 'double-sided' means both the front (front side) and the back (back side) of a semiconductor die.

Hereinafter, embodiments of the inventive concept will be described in detail with reference to the accompanying drawings.

Figure 1:
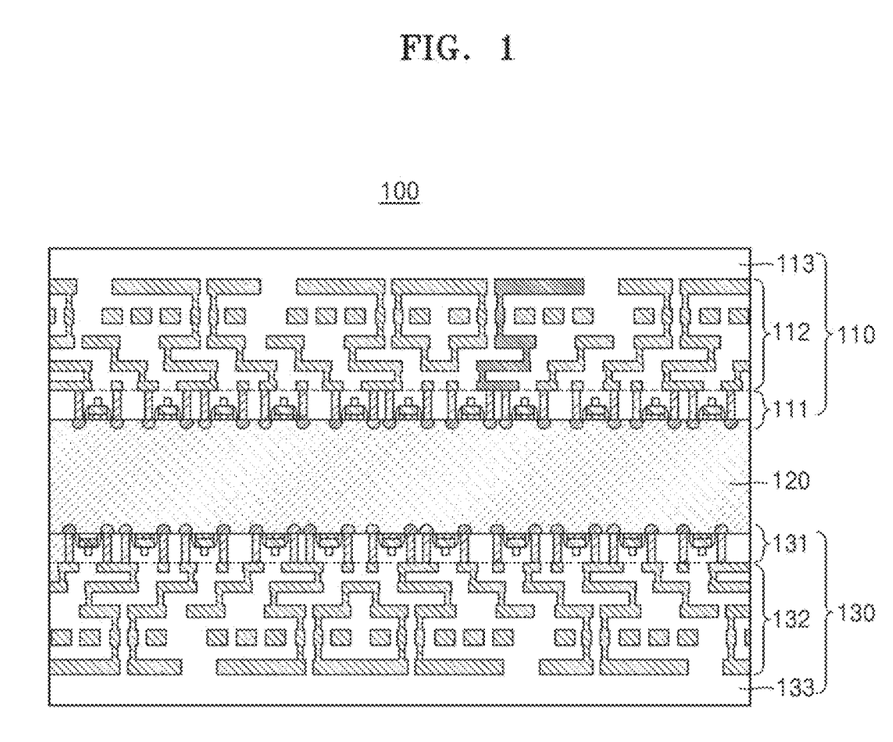
FIG. 1 is a view illustrating an integrated circuit die according to an embodiment.

FIG. 1 is a view illustrating an integrated circuit die according to an embodiment, and the integrated circuit illustrates an embodiment in which semiconductor ICs are formed back-to-back on the front and back of a single die using bulk CMOS technology.

A semiconductor IC may be composed of multiple layers that are built one layer at a time on a semiconductor substrate, and a final semiconductor chip may include about 30 or more layers. Each layer may include electronic components such as transistors, and the transistors are implemented by precisely defining locations where n-type and p-type areas will be located in each layer of active regions on the substrate. In addition, each layer is etched using lines and geometric shapes at precise locations where semiconductor materials will be deposited. In a semiconductor IC design, an IC layout, also known as an IC mask layout or mask design, is a representation of an IC as a planar geometric shape corresponding to a pattern of metal, oxide, or semiconductor layers that implement components of the IC.

Referring to FIG. 1, an integrated circuit die 100 according to an embodiment includes a substrate 120, a front structure (hereinafter referred to as a head) 110 formed on a front side of the substrate 120, and a back structure (hereinafter referred to as a tail) 130 formed on a back side of the substrate 120.

The substrate 120 may be a bulk substrate including silicon. However, the disclosure is not limited thereto. The substrate 120 may include a semiconductor material such as germanium, silicon germanium, silicon carbide, etc. Alternatively, the substrate 120 may include a semiconductor material such as gallium arsenide, gallium nitride, gallium antimonide, indium antimonide, lead tellurium compound, indium arsenide, indium phosphide, etc.

The head 110 includes multiple IC layout layers such as a first element layer (hereinafter referred to as a head transistor layer) 111, a first wiring layer (hereinafter referred to as a head metal layer) 112, a first passivation layer (hereinafter referred to as a head passivation layer) 113, etc. Similarly, the tail 130 includes another multiple IC layout layer such as a second element layer (hereinafter referred to as a tail transistor layer) 131, a second wiring layer (hereinafter referred to as tail metal layer) 132, and a second passivation layer (hereinafter referred to as a tail passivation layer) 133. In other words, wiring structures including semiconductor elements constituting an integrated circuit and vertical/horizontal electrical interconnectors for routing electrical signals to the semiconductor elements are imprinted on the head 110 on the front side of the substrate 120 and the tail 130 on the back side of the substrate 120, respectively.

According to an embodiment, the head 110 and the tail 130 are implemented independently from each other and may configure various IC components such as digital circuits, analog circuits, and memories. Therefore, the integrated circuit die 100 may include various ICs and components that require different manufacturing processes such as logic processes and memory processes on the head 110, which is the front side of the substrate 120, and the tail 130, which is the back side of the substrate 120.

FIG. 1 illustrates only some components in each layer of the integrated circuit die 100 as an example, and it is obvious that other components may be included in each layer in addition to the components illustrated in FIG. 1.

Figure 2:
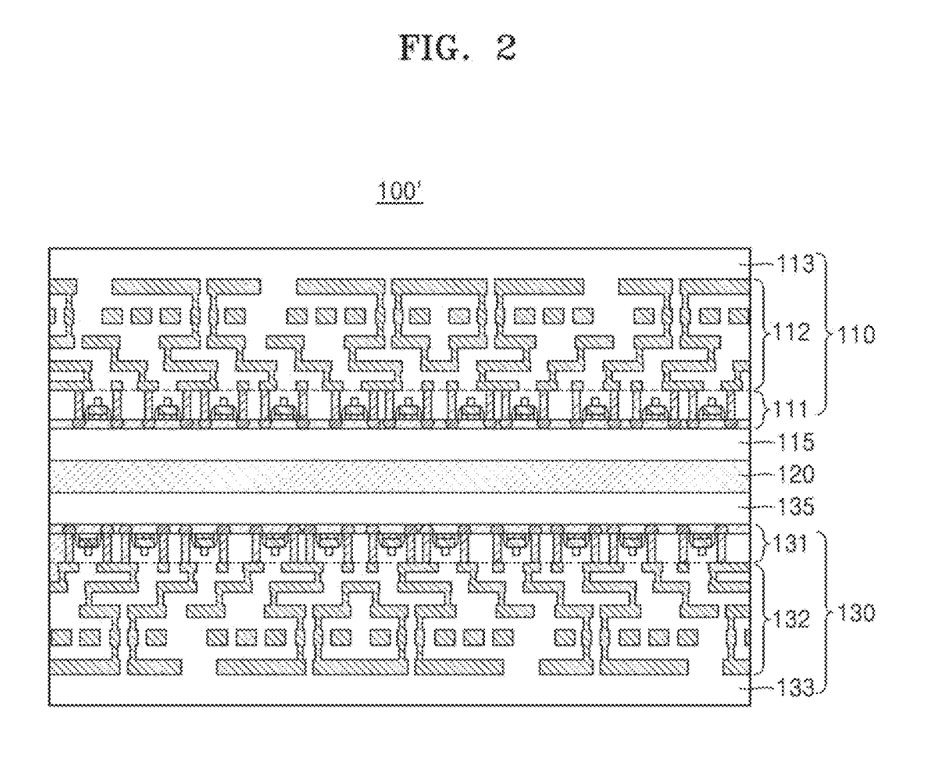
FIG. 2 is a view illustrating an integrated circuit die according to another embodiment.

FIG. 2 is a view illustrating an integrated circuit die according to another embodiment, and the integrated circuit illustrated in FIG. 2 represents an embodiment in which semiconductor ICs are formed back-to-back on front and back sides of a single die using Silicon-on-Insulator (SOI) technology. In describing FIG. 2, the same or corresponding reference numerals as in FIG. 1 denote the same elements, and descriptions thereof will not be given herein for simplicity.

Referring to FIG. 2, an integrated circuit die 100' may further include a buried insulating layer on at least one of front and back sides of the substrate 120. As illustrated in FIG. 2, the integrated circuit die 100' may include a head buried insulating layer 115 on the front side of the substrate 120 and a tail buried insulating layer 135 on the back side of the substrate 120. However, the inventive concept is not limited thereto, and either the head buried insulating layer 115 and the tail buried insulating layer 135 may be omitted.

The head 110 may be implemented through the head buried insulating layer 115 using the SOI technology. Similarly, the tail 130 may also be implemented through the tail buried insulating layer 135 using the SOI technology. Therefore, the head and tail buried insulating layers 115 and 135 may be independently implemented on both sides of the substrate 120.

The head buried insulating layer 115 and the tail buried insulating layer 135 may reduce parasitic capacitance in transistors of corresponding layers of the head transistor layer 111 and the tail transistor layer 131, respectively, to improve performance.

A material constituting a buried insulating layer varies greatly depending on the intended use. For example, silicon dioxide may be used as a buried insulating layer to reduce short-channel effects in other microelectronic devices, and sapphire may be used as a buried insulating layer in high-performance radio frequency (RF) and radiation-sensitive applications.

In semiconductor engineering, a TSV is a vertical electrical connection (via) that passes through a silicon wafer or die. A 3D IC is a chip that is stacked vertically like a 3D package, but operates as a single device, so the 3D IC may pack more functions into a relatively small space. In addition, the TSV may improve signal transmission speed by providing short connections between different layers and different dies.

The TSV is formed by etching a trench in silicon and then filling it with an insulating liner and metal wire. TSV implementation may be divided into three methods: 'via-first', 'via-middle', and 'via-last', depending on a via configuration method.

In a via-first integration method, a TSV is implemented before a front-end-of-line (FEOL) stage (a stage where transistors, capacitors, resistors, etc. are formed). A via-first TSV is inserted into a substrate before other processing (including FEOL processing such as ion implantation). This has the advantage of process flexibility during a TSV module process (etching, lining, and filling), but has the disadvantage of setting thermal budget constraints for subsequent processes depending on materials used in the TSV module process. In a via-middle integration method, a TSV is inserted after the FEOL stage, which usually consists of numerous high-temperature processes, is completed. In a via-last integration method, a TSV is fabricated after both FEOL and back-end-of-line (BEOL) processes are completed.

Because the FEOL and BEOL processes are already well known, a detailed description is omitted. However, general metals connecting IC devices may be copper and aluminum, and multi-layer metal routing is performed during the BEOL process. In addition, while via-first/middle TSVs follow characteristics of semiconductor interconnect technology, a via-last TSV is closer to assembly interconnect technology.

FIGS. 3 to 6 are views illustrating embodiments of implementing interconnect or intercontact between layout layers in a single die using a TSV, according to embodiments. FIGS. 3 to 6 illustrate embodiments in which various TSVs are implemented in the integrated circuit die 100 of FIG. 1, respectively. In describing FIGS. 3 to 6, the same or corresponding reference numerals as in FIG. 1 denote the same elements, and descriptions thereof will not be given herein for simplicity.

Figure 3:
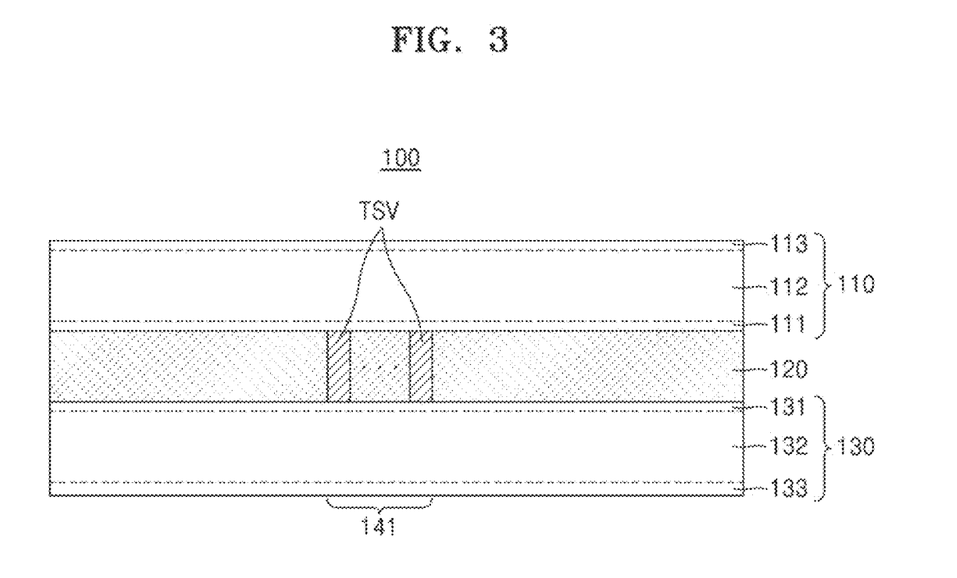
FIGS. 3 to 6 are views illustrating examples of TSV implementations for providing interconnects between different layout layers in an integrated circuit die, according to embodiments.

FIG. 3 illustrates an embodiment in which TSVs are implemented using a via-first process in both the head 110 and the tail 130.

Referring to FIG. 3, the head 110 and the tail 130 are electrically connected to each other through at least one first vertical interconnector (hereinafter referred to as a via-first TSV) 141.

The via-first TSV 141 is fabricated before actual semiconductor elements such as transistors are patterned in the head and tail transistor layers 111 and 131 or before the head and tail metal layers 112 and 132 are placed. The via-first process includes an exposure process that creates a deep via in silicon from the top and bottom of the substrate 120 and then exposes both sides of the substrate 120, that is, one side on the head 110 side and one side on the tail 130 side. Subsequently, the head transistor layer 111, the head metal layer 112, and the head passivation layer 113 may be sequentially formed on a front side of the substrate 120, and the tail transistor layer 131, the tail metal layer 132, and the tail passivation layer 133 may be sequentially formed on a back side of the substrate 120.

This technology is based on filling high aspect ratio trenches with, for example, doped polysilicon. The via-first TSV 141 may be very large, for example, several microns in diameter, and have a high aspect ratio compared to other features of an integrated circuit.

Figure 4:
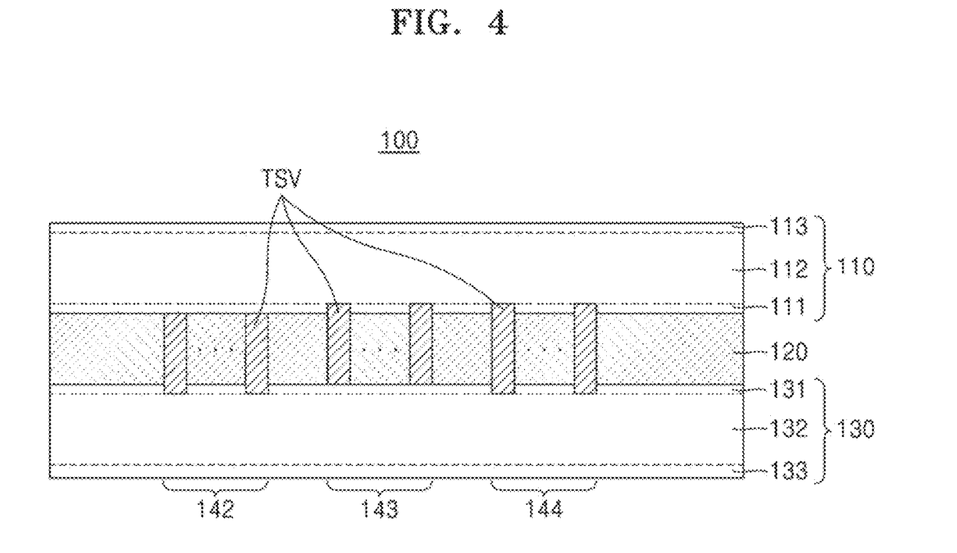

FIG. 4 illustrates an embodiment of implementing a TSV using at least one via-middle process in the head 110 and the tail 130.

Referring to FIG. 4, the head 110 and the tail 130 are electrically connected to each other through at least one of second vertical interconnectors (hereinafter referred to as via-middle TSVs) 142, 143, and 144.

The via-middle TSV 142 may be formed simultaneously using the via-first process in the head 110 and the via-middle process in the tail 130, and may penetrate through the substrate 120 and the tail transistor layer 131 and be connected to wiring structures for electrical signal routing of the head transistor layer 111 and the tail metal layer 132.

The via-middle TSV 143 may be formed simultaneously using the via-middle process in the head 110 and the via-first process in the tail 130, and may penetrate through the substrate 120 and the tail transistor layer 111 and be connected to wiring structures for electrical signal routing of the head metal layer 112 and the tail transistor layer 131.

The via-middle TSV 144 may be formed simultaneously using the via-middle process both in the head 110 and the tail 130, and may penetrate through the substrate 120 and the head and tail transistor layers 111 and 131 and be connected to wiring structures for electrical signal routing of the head metal layer 112 and the tail metal layer 132.

Unlike the via-first TSVs, the via-middle TSVs 142, 143, and 144 connect to an upper metal layer including fat-wires routing IC components. The via-middle TSVs are formed after an FEOL process is completed but before a BEOL process starts, that is, before a metal layer is laid down. This is the most widely used TSV formation and placement method in relation to interposer stacks and 3D integrated chips.

As described above, the via-middle TSVs 142, 143, and 144 are integrated prior to formation of a BEOL structure. A manufacturing process of the via-middle TSVs 142, 143, and 144 may be described in more detail by taking a typical filling sequence for a copper (Cu)-based TSV as an example, which may be manufactured in the following sequence: a) liner deposition (wherein the liner acts as a dielectric isolation between Si and Cu), b) barrier deposition to prevent copper from migrating to the liner, c) seed deposition and subsequent plating, and d) chemical mechanical polishing (CMP) to remove overload after plating. The Via-middle TSVs are currently a widely used option for advanced 3D ICs and interposer stacks.

Figure 5:
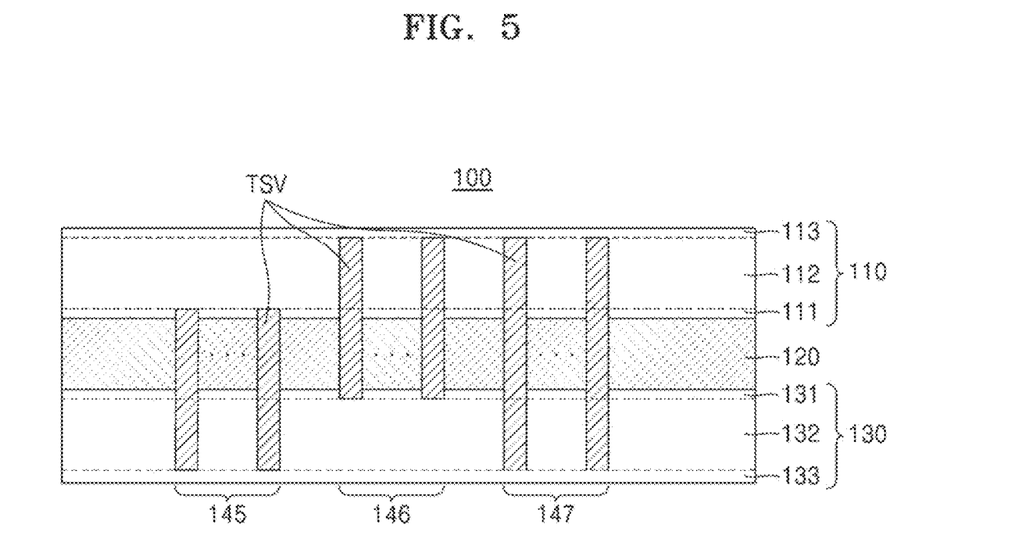

FIG. 5 illustrates an embodiment of implementing a TSV using at least one via-last process in the head 110 and the tail 130.

Referring to FIG. 5, the head 110 and the tail 130 are electrically connected to each other through third vertical interconnectors (hereinafter referred to as via-last TSVs) 145, 146, and 157.

The via-last TSV 145 may be formed simultaneously using the via-middle process in the head 110 and the via-last process in the tail 130, and may penetrate through the head transistor layer 111, the substrate 120, the tail transistor layer 131, and the tail metal layer 132 and be connected to wiring structures for electrical signal routing of the head metal layer 112 and the tail metal layer 132.

The via-last TSV 146 may be formed simultaneously using the via-last process in the head 110 and the via-middle process in the tail 130, and may penetrate through the tail transistor layer 131, the substrate 120, the head transistor layer 111, and the head metal layer 112 and be connected to wiring structures for electrical signal routing of the tail metal layer 132 and the head metal layer 112.

The via-last TSV 147 may be formed simultaneously using the via-last process both in the head 110 and the tail 130, and may penetrate through the substrate 120, the head and tail transistor layers 111 and 131, and the head and tail metal layers 112 and 132 and be connected to wiring structures for electrical signal routing of the head metal layer 112 and the tail metal layer 132.

The via-last TSVs 145, 146, and 147 are formed after both FEOL and BEOL processes are completed. That is, the via-last TSVs 145, 146, and 147 are formed during or after BEOL processing (interconnect between horizontal/flat metal and adjacent metal layers by vertical vias within a metal layer) on top of a full thickness wafer of the head 110 and/or the tail 130. The via-last process may provide a cost-effective and flexible solution for 3D integration of homogeneous and heterogeneous components, such as image sensors and stacked DRAMs.

Figure 6:
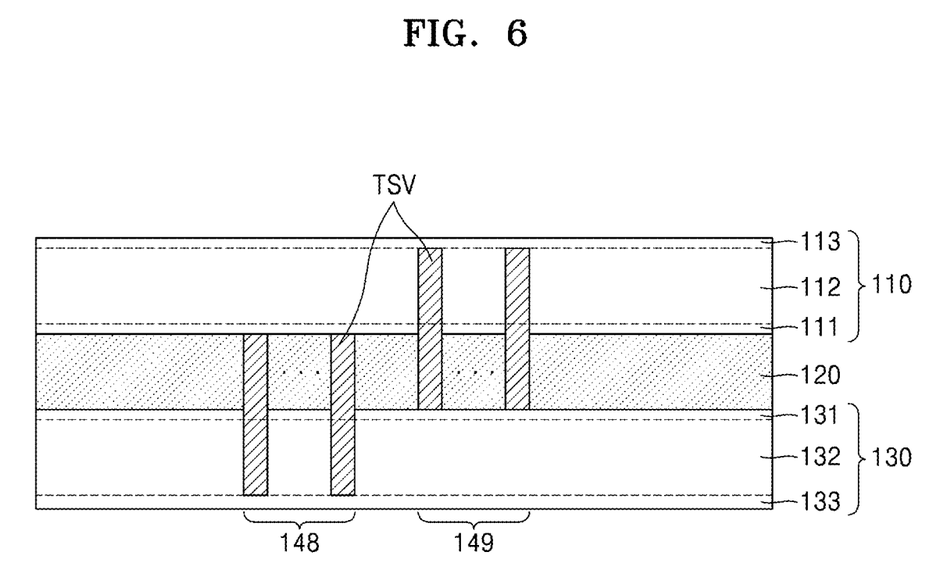

FIG. 6 illustrates an embodiment of implementing a TSV using at least one via-last process in the head 110 and the tail 130, and is a view illustrating other examples of using the via-last process, as an embodiment that simultaneously uses both the via-first and via-last processes, unlike the embodiment illustrated in FIG. 5.

Referring to FIG. 6, the head 110 and the tail 130 are electrically connected to each other through fourth vertical interconnectors (hereinafter referred to as via-last TSVs) 148 and 149.

The via-last TSV 148 may be formed simultaneously using the via-first process in the head 110 and the via-last process in the tail 130, and may penetrate through the substrate 120, the tail transistor layer 131, and the tail metal layer 132 and be connected to wiring structures for electrical signal routing of the head metal layer 111 and the tail metal layer 132.

The TSV 139 may be formed simultaneously using the via-last process in the head 110 and the via-first process in the tail 130, and may penetrate through the substrate 120, the head transistor layer 111, and the head metal layer 112 and be connected to wiring structures for electrical signal routing of the tail transistor layer 131 and the head metal layer 112.

As illustrated in the drawings of FIGS. 3 to 6, TSVs formed across different layers of the integrated circuit die 100 may provide short interconnects between various IC components or IC devices formed in the head 110 and the tail 130 respectively, which require not only a homogeneous manufacturing process but also a heterogeneous manufacturing process. That is, TSVs arranged across different layers within the head 110 and the tail 130 respectively formed on both sides of the same substrate 120 in a single integrated circuit die 100 may provide shorter interconnects between various IC components of heterogeneous and/or homogeneous processes. For example, to provide a high bandwidth memory (HBM) interface between a controller and a DRAM in a single die, a controller component requiring a random logic process may be implemented in the head 110, and a DRAM component requiring a memory process may be implemented in the tail 130.

Figure 7:
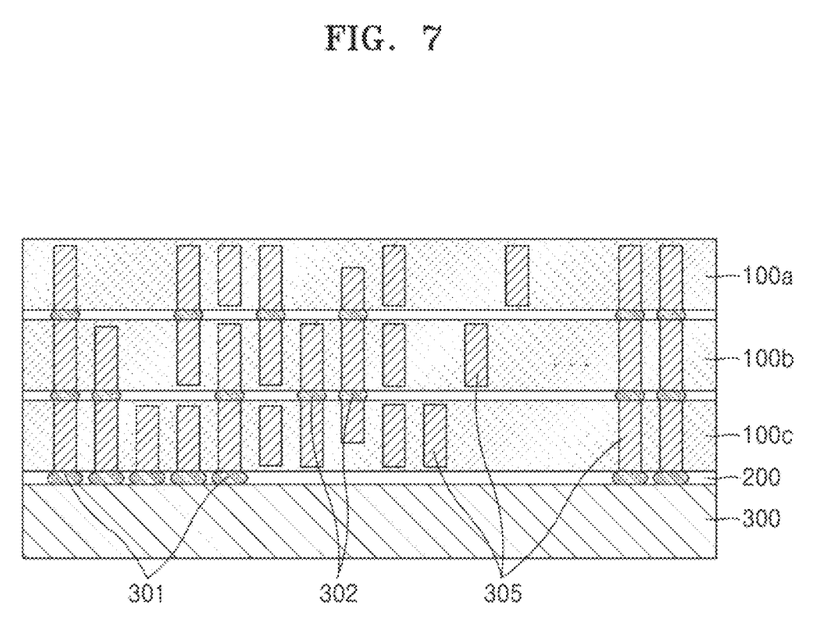
FIG. 7 is a view illustrating an integrated circuit package according to an embodiment.

FIG. 7 is a view illustrating an integrated circuit package according to an embodiment. FIG. 7 illustrates an example in which integrated circuit dies 100a, 100b, and 100c corresponding to the integrated circuit dies described in FIG. 1 are stacked on a package substrate 300 to form an integrated circuit die stack structure. However, this is exemplary, and some of the integrated circuit dies 100a, 100b, and 100c in the integrated circuit die stack structure may have a typical integrated circuit die structure in which an integrated circuit is formed on only one side, not both sides. In addition, the number of stacked dies may vary as needed.

In IC packaging, a solder ball (or a ball) or solder bump (or a bump) is a ball-shaped conductive adhesive that provides contact between a chip package and a printed circuit board or between stack packages of multichip modules.

Referring to FIG. 7, at least one first connector (hereinafter referred to as a solder ball) 301 is arranged between the package substrate 300 and the lower integrated circuit die 100c to electrically connect the package substrate 300 and the integrated circuit die 100c, and at least one second connector (hereinafter referred to as a solder bump) 302 is arranged between the integrated circuit dies 100a, 100b, and 100c to electrically connect the first to third integrated circuit dies 100a, 100b, and 100c. In addition, a TSV 305 is formed between other layers inside the integrated circuit dies 100a, 100b or 100c to provide interconnect.

As a result, combination of the solder balls 301, the solder bump 302, and the TSV 305 may provide various electrical interconnects across the stacked integrated circuit dies.

For example, in a 3D integrated circuit package illustrated in FIG. 7, a connection example is shown in which the upper integrated circuit die 100a is connected to the lower integrated circuit die 100c by the solder bump 302 and then mounted to the package substrate 300 via the solder ball 301.

In addition, FIG. 7 shows two other connection examples. One is a connection that extends from the middle integrated circuit die 100b to the lower integrated circuit die 100c and is mounted on the package substrate 300, and the other is mounted and connected from the lower integrated circuit die 100c to the package substrate 300.

The mounting to the package substrate 300 using the solder ball 301 may be performed independently of interconnecting between different integrated circuit dies using the solder bump 302.

The solder ball 301 and the solder bump 302 described above may generally have a small spherical shape that is bonded to a contact area or pad of a semiconductor device or a circuit board. After using the solder ball 301 to attach an IC chip (e.g., an integrated circuit die) to a package substrate such as a printed circuit board (PCB) or using the solder bump 302 to connect between integrated circuit dies, often the remaining air gap between them may be filled with a filler 200 such as an epoxy or adhesive.

Figure 8:
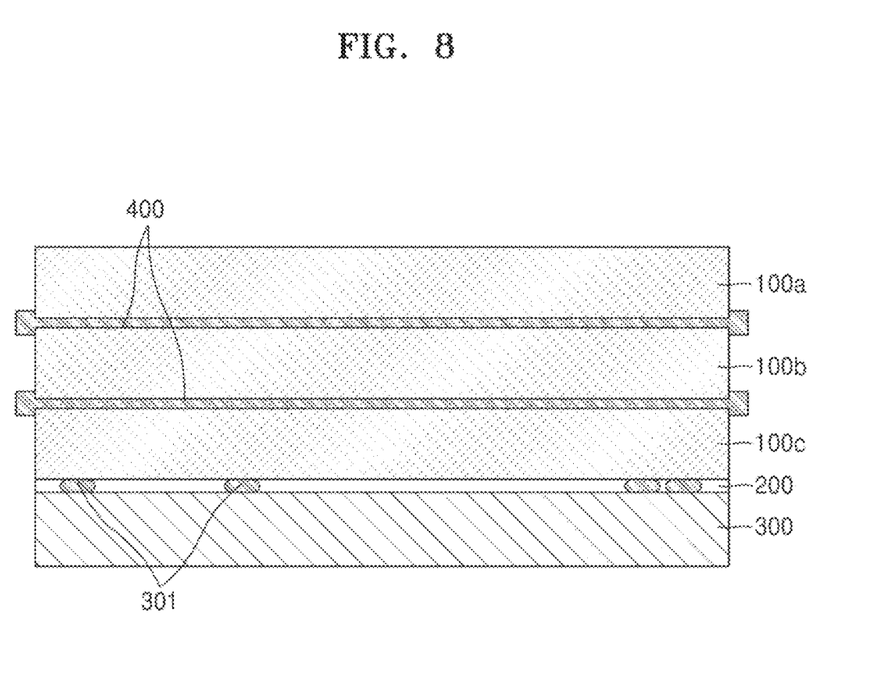
FIG. 8 is a view illustrating an integrated circuit package according to another embodiment.

FIG. 8 is a view illustrating an integrated circuit package according to another embodiment. FIG. 8 illustrates an embodiment in which the integrated circuit dies 100a, 100b, and 100c corresponding to the integrated circuit dies described in FIG. 1 are stacked on the package substrate 300 to form an integrated circuit die stack structure, and heat dissipation members 400 are respectively arranged between adjacent integrated circuit dies in the integrated circuit die stack structure to manage heat. However, this is exemplary, and some of the integrated circuit dies 100a, 100b, and 100c in the integrated circuit die stack structure may have a typical integrated circuit die structure in which an integrated circuit is formed on only one side, not both sides. Furthermore, the number of heat dissipation members and stack dies may vary as needed. In addition, arrangement locations of the heat dissipation members may also vary. According to an embodiment, a heat dissipation member may be arranged on a lower side of the package substrate, or may also be arranged on a lower side of the integrated circuit die stack structure (i.e., between the package substrate and the integrated circuit die stack structure) or on an upper side of the integrated circuit die stack structure.

The heat dissipation member 400 may be implemented as a passive heat exchanger (heat sink) and/or a fluid channel (radiator), and may transfer and release heat energy generated from the integrated circuit dies 100a, 100b, and 100c to the outside to enable temperature control.

A method of attaching a heat dissipation member and a thermal interface material may affect the temperature of an integrated circuit die. The heat dissipation member may generally be made of aluminum or copper. For reference, the radiator exchanges heat through convection in addition to heat conduction and radiation, and the heat sink does not have any fluid flowing inside.

The heat dissipation member 400 may be used to cool components such as CPUs, GPUs, and DRAM modules where heat dissipation capacity of the components is insufficient to control temperature. The heat dissipation members 400 may be connected to another external component (not shown) to efficiently disperse and discharge heat energy generated from the integrated circuit dies 100a, 100b, and 100c to the surroundings such as air.

As described above, the disclosure relates to a method of increasing the integration density of a semiconductor integrated circuit per unit area, and more particularly, unlike a conventional method of forming a semiconductor integrated circuit on only one side of a die, provides a method of forming a semiconductor integrated circuit on both sides of a die and interconnecting not only the same die but also different dies through TSVs.

According to an embodiment, a die includes a semiconductor substrate and a front side (head) and a back side (tail), and forms integrated circuits on both the front side and the back side, respectively. In addition, components implemented on the front side and the back side of the die may be interconnected through TSVs that penetrate through the semiconductor substrate inside the die. Furthermore, components implemented on different dies may be interconnected through TSVs that penetrate through the die.

According to another embodiment, a heat dissipation member inserted between dies effectively discharges generated heat to the outside, thereby enabling thermal management of a system.

According to embodiments, the integration density of a semiconductor integrated circuit per unit area is increased, and fast signal transmission is possible between components having not only a homogeneous semiconductor manufacturing process but also a heterogeneous semiconductor manufacturing process, thereby providing a high-performance interface between a processor and a network device (e.g., a high-bandwidth memory (HBM) between a processor and a memory) and increasing the system performance.

While the disclosure has been particularly shown and described with reference to embodiments thereof, it will be understood that various changes in form and details may be made therein without departing from the scope of the following claims.

What is claimed is:

1. An integrated circuit die comprising:
    a substrate including a front side and a back side opposite to the front side;
    a front structure including a first element layer on the front side of the substrate and a first wiring layer on the first element layer;
    a back structure including a second element layer on the back side of the substrate and a second wiring layer on the second element layer; and
    at least one vertical interconnector penetrating through the substrate, the first element layer and the first wiring layer, or penetrating through the substrate, the second element layer, and the second wiring layer,
    wherein the first element layer includes at least one semiconductor element having an active region defined in a region adjacent to the front side within the substrate,
    wherein the second element layer includes at least one semiconductor element having an active region defined in a region adjacent to the back side within the substrate, and
    wherein each of the front structure and the back structure constitutes an integrated circuit device with different structures and functions.

2. The integrated circuit die of claim 1, wherein the substrate is a bulk substrate.

3. The integrated circuit die of claim 1, further comprising:
    a buried insulating layer disposed at least one of between the front side of the substrate and the first element layer and between the back side of the substrate and the second element layer.

4. The integrated circuit die of claim 1, further comprising:
    at least one first vertical interconnector penetrating through the substrate and electrically connected to the first element layer and the second element layer.

5. The integrated circuit die of claim 1, further comprising:
    at least one second vertical interconnector penetrating through the substrate and the first element layer and electrically connected to the first wiring layer and the second element layer, or penetrating through the substrate and the second element layer and electrically connected to the second wiring layer and the first element layer, or penetrating through the substrate and the first and second element layers and electrically connected to the first wiring layer and the second wiring layer.

6. The integrated circuit die of claim 1, further comprising:
    at least one third vertical interconnector penetrating through the substrate, the first and second element layers, and the first and second wiring layers.

7. An integrated circuit package comprising:
    a package substrate;
    an integrated circuit die stack structure disposed on the package substrate and including at least two integrated circuit dies; and
    at least one connector electrically connecting the package substrate and a lower integrated circuit die of the integrated circuit die stack structure, or electrically connecting between the at least two integrated circuit dies of the integrated circuit die stack structure,
    wherein at least one of the at least two integrated circuit dies includes a front structure formed on a front side of a substrate, a back structure formed on a back side of the substrate and at least one vertical interconnector penetrating through the substrate and the front structure, or penetrating through the substrate and the back structure,
    wherein the front structure includes at least one semiconductor element having an active region defined in a region adjacent to the front side within the substrate,
    wherein the back structure includes at least one semiconductor element having an active region defined in a region adjacent to the back side within the substrate,
    wherein each of the front structure and the back structure constitutes an integrated circuit device with different structures and functions.

8. An integrated circuit package comprising:
    a package substrate;
    an integrated circuit die stack structure disposed on the package substrate and including at least two integrated circuit dies; and
    a heat dissipation member disposed on a lower side of the package substrate, or between the package substrate and the integrated circuit die stack structure, or between two adjacent integrated circuit dies of the integrated circuit die stack structure, or on an upper side of the integrated circuit die stack structure,
    wherein at least one of the at least two integrated circuit dies includes a front structure formed on a front side of a substrate, a back structure formed on a back side of the substrate and at least one vertical interconnector penetrating through the substrate and the front structure, or penetrating through the substrate and the back structure,
    wherein the front structure includes at least one semiconductor element having an active region defined in a region adjacent to the front side within the substrate,
    wherein the back structure includes at least one semiconductor element having an active region defined in a region adjacent to the back side within the substrate,
    wherein each of the front structure and the back structure constitutes an integrated circuit device with different structures and functions.

* * * * *